US008194636B1

(12) United States Patent
Doherty et al.

(10) Patent No.: US 8,194,636 B1
(45) Date of Patent: Jun. 5, 2012

(54) ADAPTIVE TIMING SYNCHRONIZATION FOR MESH NETWORKS

(75) Inventors: Lance R. Doherty, Oakland, CA (US);
Robert M. Shear, El Cerrito, CA (US);
Jonathan Simon, Castro Valley, CA (US); Zhenqiang Ye, Fremont, CA (US)

(73) Assignee: Dust Networks, Inc., Hayward, CA (US)

( * ) Notice: Subject to any disclaimer, the term of this patent is extended or adjusted under 35 U.S.C. 154(b) by 90 days.

(21) Appl. No.: 11/973,295

(22) Filed: Oct. 5, 2007

Related U.S. Application Data

(60) Provisional application No. 60/849,663, filed on Oct. 5, 2006.

(51) Int. Cl.
*H04J 3/06* (2006.01)
(52) U.S. Cl. ........................ 370/350; 370/509
(58) Field of Classification Search .................. None
See application file for complete search history.

(56) References Cited

U.S. PATENT DOCUMENTS

| | | | | |
|---|---|---|---|---|
| 5,172,075 A * | 12/1992 | Yerbury et al. | ............... | 331/14 |
| 5,537,549 A * | 7/1996 | Gee et al. | .................. | 709/224 |
| 5,860,112 A * | 1/1999 | Langendorf et al. | .......... | 711/143 |
| 6,891,841 B2 * | 5/2005 | Leatherbury et al. | ......... | 370/401 |
| 7,123,106 B2 * | 10/2006 | Zhang et al. | ................... | 331/66 |
| 7,151,945 B2 * | 12/2006 | Myles et al. | ................ | 455/502 |
| 7,596,152 B2 * | 9/2009 | Yarvis et al. | ................ | 370/503 |
| 7,924,766 B2 * | 4/2011 | Sahinoglu et al. | ............ | 370/321 |
| 2005/0093638 A1 * | 5/2005 | Lin et al. | ..................... | 331/176 |
| 2006/0187866 A1 * | 8/2006 | Werb et al. | .................... | 370/311 |
| 2006/0195547 A1 * | 8/2006 | Sundarrajan et al. | ......... | 709/217 |

* cited by examiner

*Primary Examiner* — Andrew Lai
*Assistant Examiner* — Alex Skripnikov
(74) *Attorney, Agent, or Firm* — McDermott Will & Emery LLP

(57) ABSTRACT

Timing synchronization for mesh networks is disclosed. A temperature calibration data is received. A plurality of previously stored calibration values each corresponding to different temperatures is adjusted based at least in part on the received temperature calibration data. A temperature measurement is received. A first clock offset is determined based at least in part on the adjusted plurality of previously stored calibration values and the temperature measurement.

23 Claims, 14 Drawing Sheets

ADAPTIVE TIMING SYNCHRONIZATION FOR MESH NETWORKS

CROSS REFERENCE TO OTHER APPLICATIONS

This application claims priority to U.S. Provisional Patent Application No. 60/849,663 entitled ADAPTIVE TIMING SYNCHRONIZATION FOR MESH NETWORKS filed Oct. 5, 2006 which is incorporated herein by reference for all purposes.

BACKGROUND OF THE INVENTION

Typically in a network of devices which must have low power consumption, communicating devices may sleep for long periods and rely on clocks to wake up and communicate with each other during a defined time slot. One solution is to use a sufficiently precise clock at each transmitter and each receiver so that the transmitters and receivers time slots remain aligned. Precise clocks are expensive and also tend to use more power than less precise clocks. Another solution is to specify long enough time slots so that the imprecise clocks can drift relative to each other and still have sufficient time and overlap in the sending and receiving slots to effectively communicate. Wider time slots do not use communication bandwidth in the network very efficiently and receivers use more power with longer time slots because they need to listen longer in the time slots for a transmission.

BRIEF DESCRIPTION OF THE DRAWINGS

Various embodiments of the invention are disclosed in the following detailed description and the accompanying drawings.

DETAILED DESCRIPTION

Figure 1A:
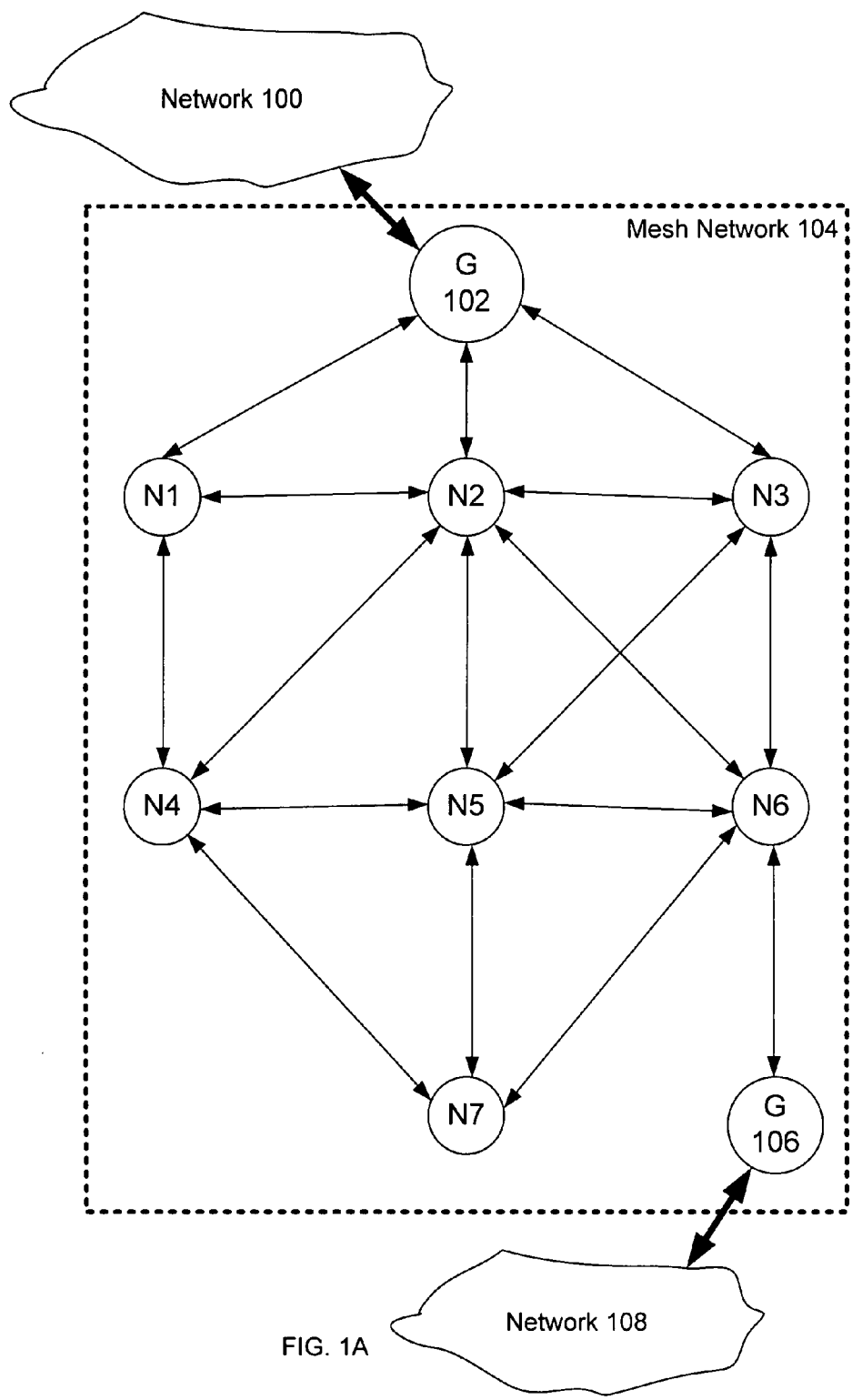
FIG. 1A is a block diagram illustrating an embodiment of a mesh network.

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Adaptive synchronization is disclosed. A characteristic calibration curve for an oscillator as a function of temperature is stored locally in mesh network node (e.g., upon initial loading of the node). The calibration curve is adjusted using one or more temperature calibration points (e.g., during manufacturing testing). The adjusted calibration curve is used to determine a first clock offset at a measured temperature. The clock offset is used to adjust a local clock.

In some embodiments, the stored characteristic calibration curve comprises a generic calibration curve that is adjusted by fitting (e.g., least squares fitting) to the one or more measured temperature calibration points (e.g., part of a calibration procedure prior to deployment, sale, shipping from manufacture site, or any other appropriate calibration time).

In some embodiments, timing information is received in a packet received by the local node. The received timing information is used to determine a second clock offset. The second offset is used to adjust the local clock.

In some embodiments, in the event that timing information received indicates that the local clock and the nodes or gateways that send packets to the local node are synchronized (i.e., that the clocks of the local node and the nodes or gateways that send packet to the local node are not drifting with respect to each other), a guardband time can be reduced so that a receiver is turned on for less time prior to an expected packet arrival or a keep alive interval is reduced where a keep alive packet is indicated to be required less frequently. In some embodiments, before a guardband time or a keep alive interval are changed, the nodes are observed to be synchronized for a predetermined period of time.

FIG. 1A is a block diagram illustrating an embodiment of a mesh network. In the example shown, mesh network 104 can communicate with network 100. Network 100 is a communication network and may be a local area network, a wide area network, the Internet, a wired network, a wireless network, or any other appropriate communication network. Mesh network 104 includes gateway nodes and mesh network nodes. Gateway nodes are represented in FIG. 1A as G 102 and G 106. The gateway node is able to communicate directly with a network—network 100 and network 108, respectively—and with mesh network nodes. For example, G 102 is able to directly communicate with N1, N2, and N3; G 106 is able to directly communicate with N6. Network 108 is a communication network and may be a local area network, a wide area network, the Internet, a wired network, a wireless network, or any other appropriate communication network. The gateway node may also act as a mesh network coordinator sending to and receiving from the mesh network nodes information, configuration, status updates, etc. In some embodiments, there are multiple gateway nodes that can communicate with the same network (e.g., network 100) or one or more different networks. Mesh network nodes are represented in FIG. 1A as N1, N2, N3, N4, N5, N6, and N7. In some embodiments, mesh network nodes are sensor or device mesh network nodes. A mesh network node can communicate with other mesh network nodes and gateway nodes. For example, mesh network node N6 is able to communicate directly with mesh network nodes N5, N2, N3, and N7 and with gateway node G 106. In various embodiments, the connections allow communication only in one direction (i.e., to a node or from a node) or in both directions (i.e., both to and from a node).

In the example shown in FIG. 1A, gateway and mesh network nodes communicate via radio transmitters and receivers using a packet. A packet may include a header section and a data section. The packet header may include information regarding packet type, time sent, source node, destination node, node health, number of tries for a hop, number of hops, etc. The packets are sent during defined time slots on defined frequencies using a time division multiple access (TDMA) methodology.

In some embodiments, mesh network devices synchronize to a single parent device (e.g., a gateway).

Figure 1B:
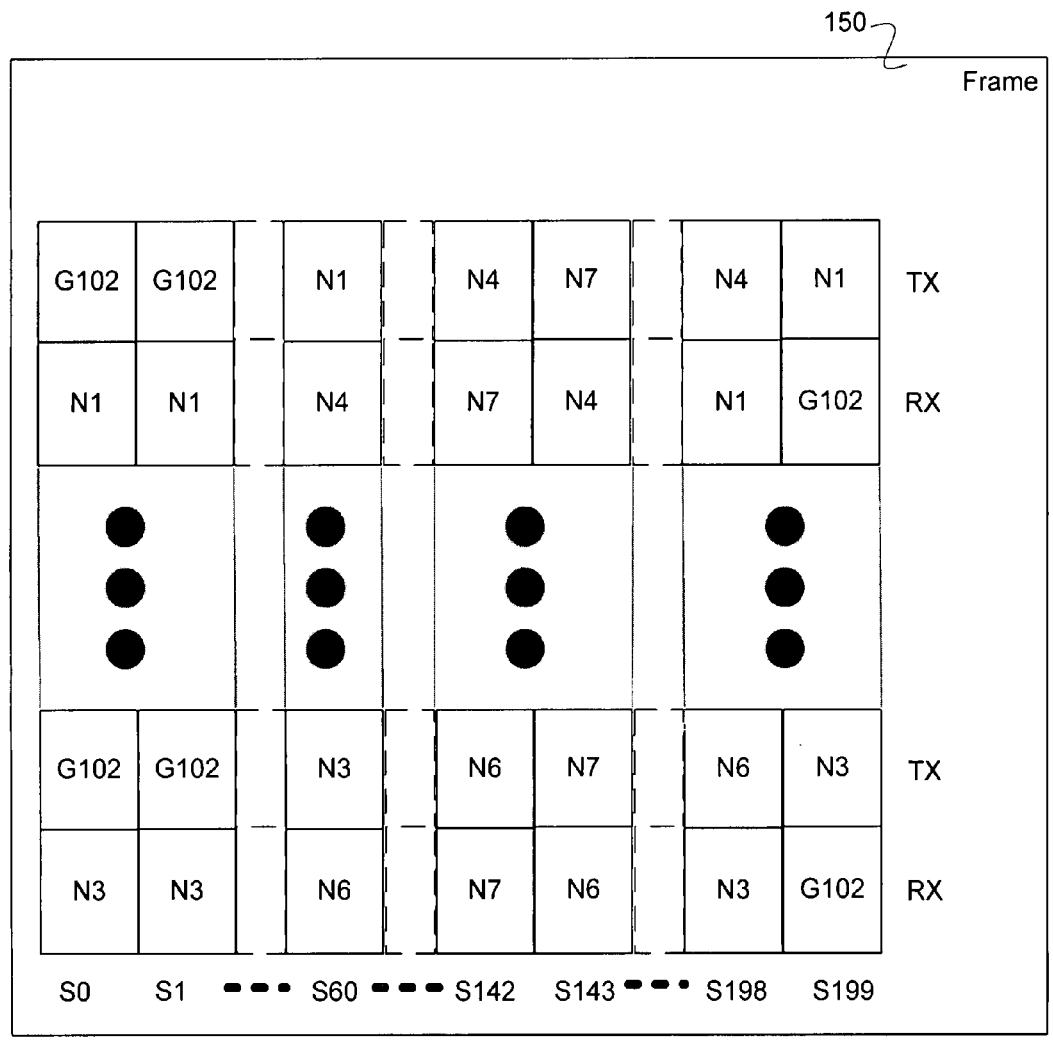
FIG. 1B is a block diagram illustrating an embodiment of a frame.

FIG. 1B is a block diagram illustrating an embodiment of a frame. In the example shown, frame 150 includes time slots that can be used to designate a receiver and a transmitter. During the time slot a designated transmitter node transmits to a designated receiver node of a mesh network. In various embodiments, the frequency used for transmission and reception is fixed, is selected from a pool of frequencies, rotates in a fixed manner, is randomly assigned, or is assigned using any other appropriate manner of assigning frequency to a transmission and reception. In some embodiments, the frequency comprises a frequency in the ISM band from 902 MHZ to 928 MHz. Frame 150 is repeated after executing the transmissions/receptions for all of its time slots. The network can support several different frames either running at different times or running concurrently. Some frames have only a few slots some have many slots depending on their design. Frame 150 contains 200 time slots (represented by S0, S1, S60, S142, S143, S198, and S199). Transmission links in the mesh network are assigned cells in a frame during which they can communicate. The transmissions and receptions for the frame are represented by designating a transmitter and a receiver for a given time slot. In S0 and S1, gateway G102 sends to node N1 and separately to N3. In S60, node N1 sends to node N4, and node N3 sends to node N6. In 5142, node N4 sends to node N7, and node N6 sends to node N7. In S143, node N7 sends to node N4, and node N7 sends to N4. In S198, node N4 sends to node N1, and node N6 sends to node N3. In S199, node N1 sends to gateway G102, and node N3 sends to gateway G102. Nodes in the mesh network are activated along a given branch of the network—only activating portions of the frame—so that a given node only sends to or receives from one other node in the mesh network. Other slots can contain transmissions and receptions between other network nodes or can be left empty.

Figure 2:
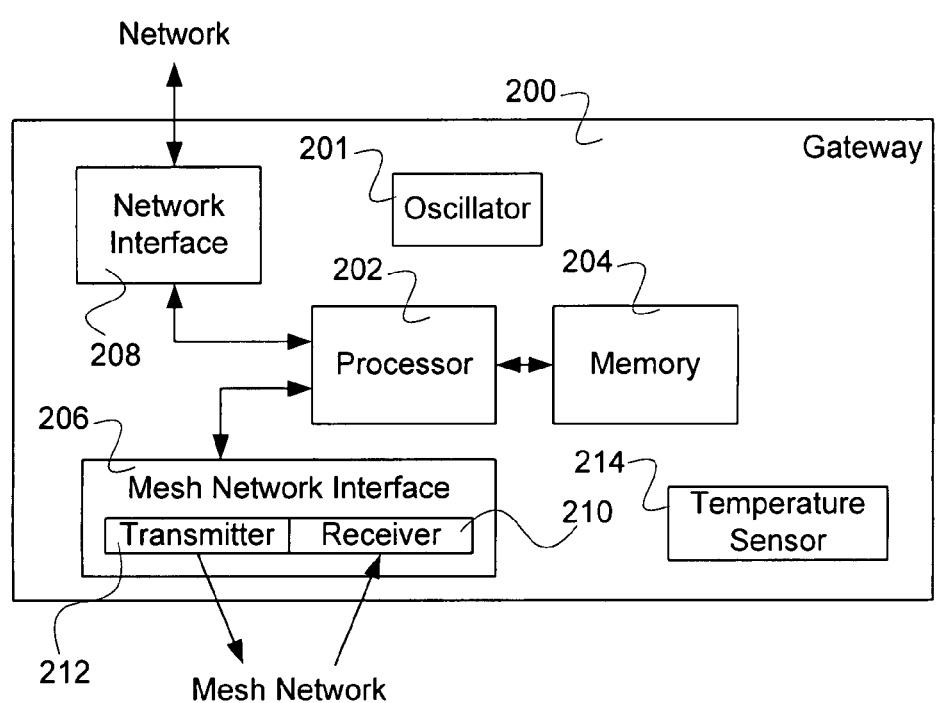
FIG. 2 is a block diagram illustrating an embodiment of a gateway of a mesh network.

FIG. 2 is a block diagram illustrating an embodiment of a gateway of a mesh network. In some embodiments, the gateway 200 of FIG. 2 is used to implement G 102 and/or G 106 in FIG. 1. In the example shown, gateway 200 includes oscillator 201, processor 202, memory 204, mesh network interface 206, and network interface 208. Processor 202 runs software that when executed manages the mesh network. Management of the mesh network can include network setup, adding nodes, removing nodes, adding frames to the network, removing frames, monitoring status, optimizing network performance by reconfiguring frames, time synchronization, and/or any other appropriate network management function. Memory 204 provides storage for processor 202 including run-time storage and instruction storage. Mesh network interface 206 includes receiver 210 and transmitter 212. Receiver 210 receives communications in the form of packets transmitted from the mesh network. Transmitter 212 transmits communications in the form of packets to the mesh network. Network interface 208 communicates with a communication network comprising of one or more devices. Information from the mesh network is passed directly to or processed by gateway 200 using processor 202 before passing to the communication network. In some embodiments, gateway 200 is line powered so that power limitations due to finite battery reserves are not an issue. In various embodiments, network management is accomplished by a remote application or is coordinated by a node in the network.

Oscillator 201 provides information that is used to determine a local clock. In various embodiments, oscillator 201 is calibrated based at least in part on: an external time standard (e.g., satellite broadcast time, internet broadcast time, or any other appropriate time reference), a local stored calibration curve, a corrected generic calibration curve (e.g., a standard curve that has been adjusted by curve-fitting to one or more calibration measurements), a complete temperature compensation process so that they can be a fully-calibrated 'timing master,' or any other appropriate calibration. Temperature sensor 214 is used to measure a temperature. The measured temperature can be used to determine the appropriate calibration for the gateway 200 clock in conjunction with the temperature calibration curve.

Figure 3:
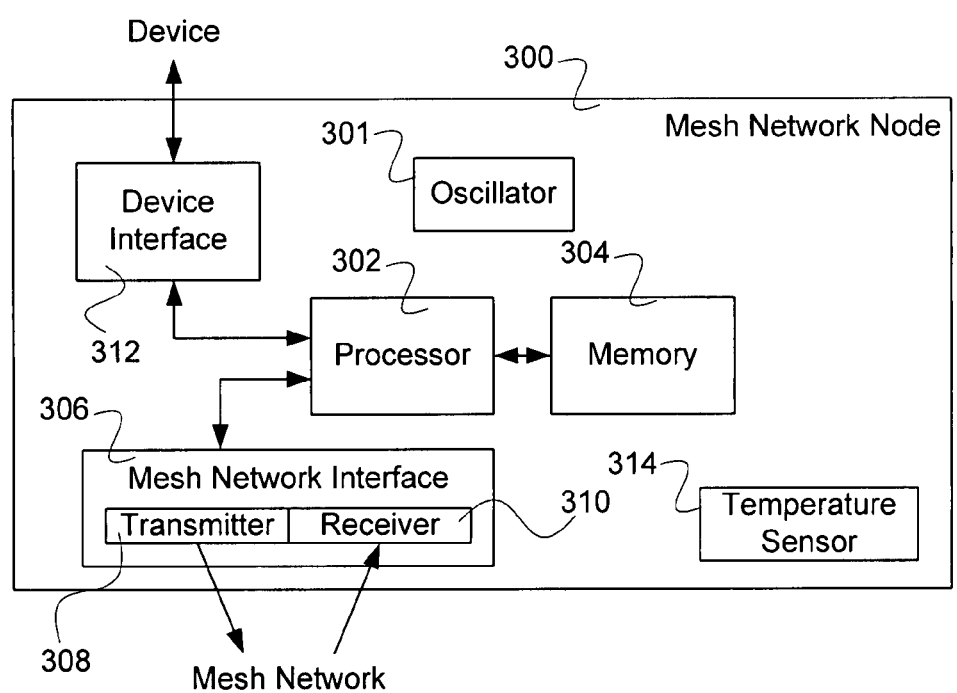
FIG. 3 is a block diagram illustrating an embodiment of a mesh network node of a mesh network.

FIG. 3 is a block diagram illustrating an embodiment of a mesh network node of a mesh network. In some embodiments, mesh network node 300 of FIG. 3 is used to implement nodes N1, N2, N3, N4, N5, N6, and/or N7 in FIG. 1. In the example shown, mesh network node 300 includes oscillator 301, processor 302, memory 304, mesh network interface 306, device interface 312, and temperature sensor 314. Processor 302 runs software that when executed operates mesh network node 300. Operation of mesh network node 300 can include setup, receiving messages, transmitting messages, adding capacity, removing capacity, providing status reports to a gateway manager such as gateway 200 in FIG. 2, time synchronization, and/or any other appropriate operating function. Memory 304 provides storage for processor 302 including run-time storage and instruction storage. Mesh network interface 306 includes receiver 310 and transmitter 308. Receiver 310 receives communications in the form of packets transmitted from the mesh network. Transmitter 308 transmits communications in the form of packets to the mesh network. In some embodiments, mesh network node 300 is usually battery powered so that power limitations due to finite battery reserves are an issue. Device interface 312 communicates with a device and/or sensor. Device and/or sensor types that can be connected to mesh network node 300 include temperature sensors, strain sensors, image sensors, vibration sensors, fluid level sensors, chemical sensors, gas sensors, radiation detectors, position sensors, acceleration sensors, inclination sensors, shock sensors, infrared sensors, sound sensors, current sensors, voltage sensors, switching device, actuator device, or any other appropriate device and/or sensor. Information to/from the sensor and/or device is passed directly to or processed by sensor mesh network node 300 using processor 302 before passing from/to the mesh network.

Oscillator 301 provides information that is used to determine a local clock. In various embodiments, oscillator 301 is calibrated based at least in part on: an external time standard (e.g., a gateway time, one or more other node time(s), satellite broadcast time, internet broadcast time, or any other appropriate time reference), a local stored calibration curve, a corrected generic calibration curve (e.g., a standard curve that has been adjusted by curve-fitting to one or more calibration measurements), or any other appropriate calibration. In some embodiments, the curve fitting used to adjust the standard curve comprises a least-squares fitting. Temperature sensor 314 is used to measure a temperature. The measured temperature can be used to determine the appropriate calibration for mesh network node 300 clock in conjunction with the temperature calibration curve.

Figure 4:
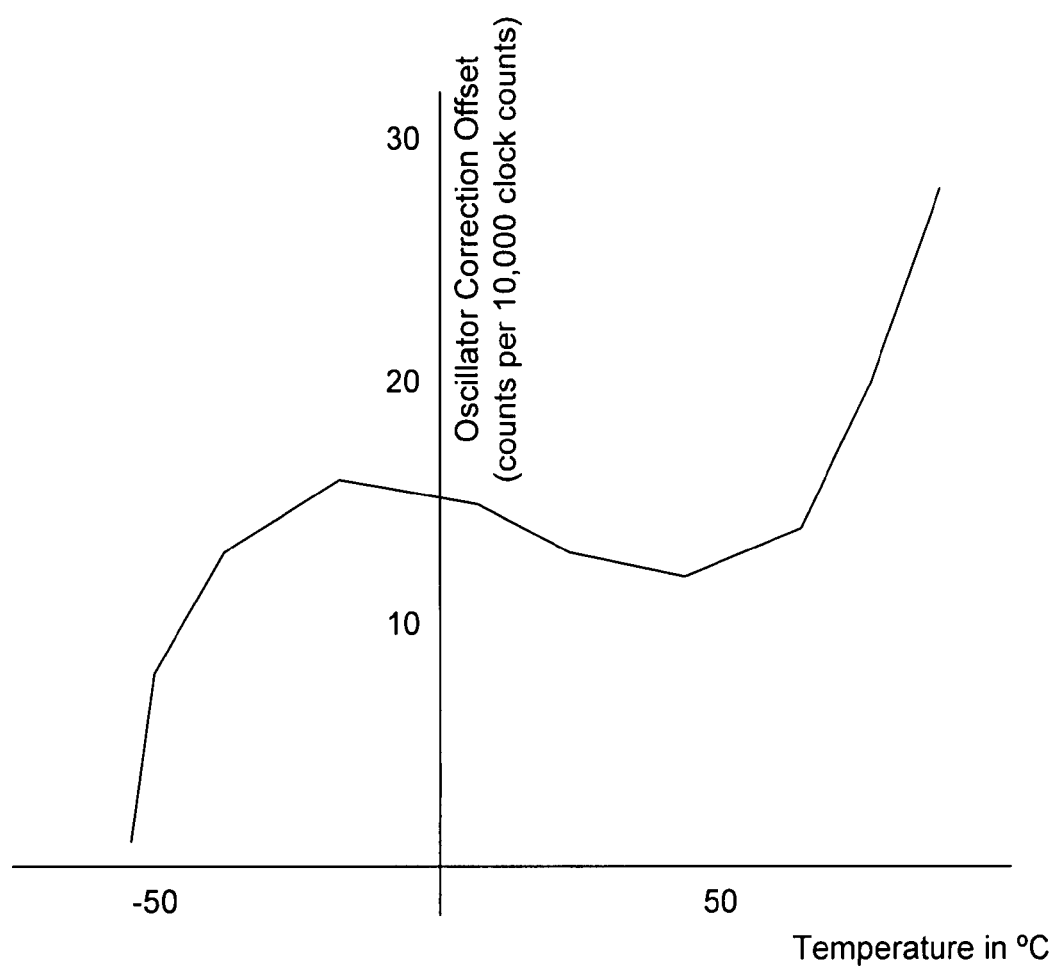
FIG. 4 is a graph illustrating a calibration curve for an oscillator in one embodiment.

FIG. 4 is a graph illustrating a calibration curve for an oscillator in one embodiment. In various embodiments, the calibration curve in FIG. 4 comprises a locally stored calibration curve, a generic calibration curve, generic crystal compensation curve, a corrected generic calibration curve. In the example shown, a representative calibration curve is shown. The x-axis indicates a range of temperature in ° C. In some embodiments, the calibration curve spans a temperature range of −50° C. to 85° C. The y-axis indicates a range of oscillator correction offsets expressed as counts per 10,000 clock counts. A calibration curve is stored in memory for use in compensation (e.g., as a table of correction values, where each correction value corresponds to a temperature).

In some embodiments, the offset is expressed in number of ticks of the oscillator before one correction tick is added. For example, a clock that oscillates at 32,768 Hz has a tick every 1/32,768 s; for a correction that adds a tick every 10,000 ticks, after 10,000 ticks are counted, the clock would add an extra tick for that correction. In the event that there are two corrections (e.g., a stored calibration table correction and a correction based on received timing information)—one every 10,000 and 1 every 20,000, then the clock would add a tick every 1/(1/10,000+1/20,000) ticks or every 6,667 ticks.

Timing synchronization comprises adapting a mesh network device oscillator or clock calibration using a learning algorithm. In some embodiments, the learning algorithm enables the clock timing for a device to be accurately calibrated without an over-temperature test to populate a compensation table for the device in spite of unit, batch, and age variations of the device timing crystals. In some embodiments, a microprocessor keeps accurate time for the device based at least in part on the compensation table for the device and the oscillator output.

Figure 5:
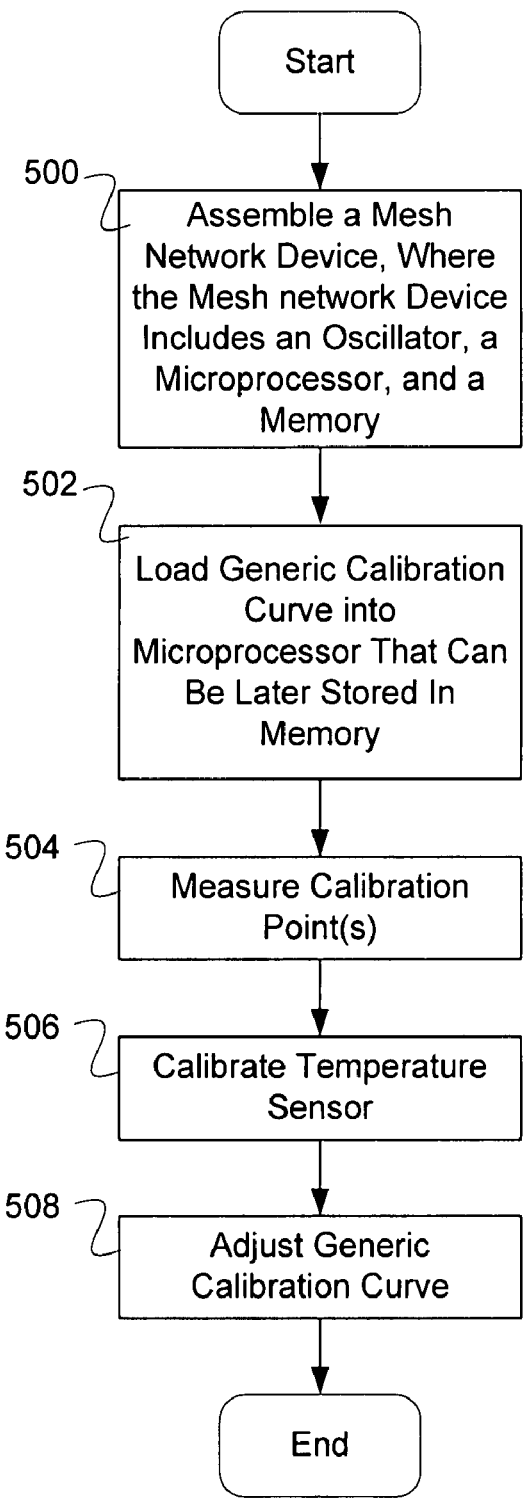
FIG. 5 is a flow diagram illustrating an embodiment of a process for calibrating a mesh network node.

FIG. 5 is a flow diagram illustrating an embodiment of a process for calibrating a mesh network node. In the example shown, in 500 a mesh network device is assembled, where the mesh network device includes an oscillator, a microprocessor, a temperature sensor, and a memory. In various embodiments, the oscillator, the microprocessor, and the memory comprise a single integrated circuit or multiple integrated circuits. In 502, a generic calibration curve is loaded into the microprocessor that can be later stored in the memory. In 504, one or more calibration points are measured. In 506, the temperature sensor is calibrated. In 508, the generic calibration curve is adjusted. In some embodiments, the generic calibration curve is adjusted using a fitting to the one or more calibration points.

Figure 6A:
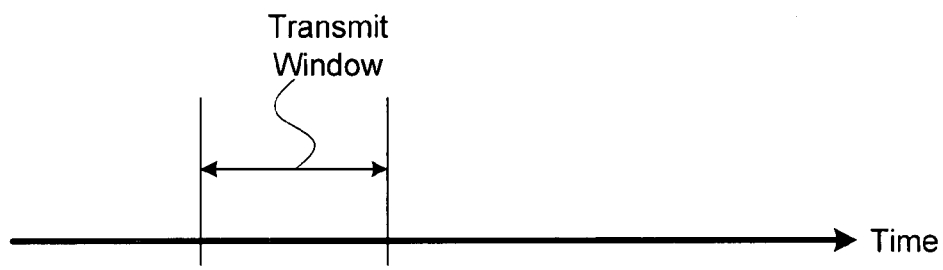
FIG. 6A is a block diagram illustrating an embodiment of a transmit window.

FIG. 6A is a block diagram illustrating an embodiment of a transmit window. In the example shown, a transmit window is shown. The transmit window is a finite period of time (e.g., a slot in a frame such as frame 150 of FIG. 1B) during which a transmission may occur between a transmitting node and a receiving node. The transmit windows are defined between the mesh network nodes during a setup of the network. One or more frames can be used to describe transmitting nodes, receiving nodes, time slots, and frequencies. One or more frames can be operational in a mesh network at a given time.

Figure 6B:
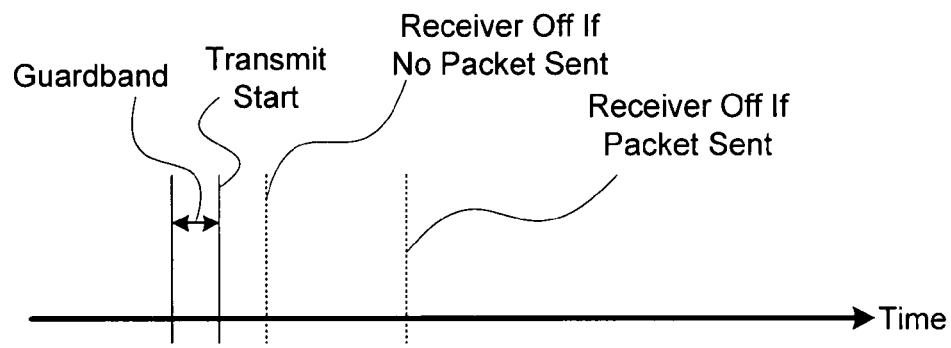
FIG. 6B is a block diagram illustrating an embodiment of a guardband for a receiver.

FIG. 6B is a block diagram illustrating an embodiment of a guardband for a receiver. In the example shown, a guardband is shown prior to the start of transmit for a transmit window. A receiver will turn on its receiver earlier than an expected transmission by the amount shown in the guardband. This guardband is a buffer time that can mitigate the effect of a clock mismatch (i.e., drift) or other issue that may cause the receiver and the transmitter to not be synchronized. The guardband, therefore, ensures that a receiver receives the entire transmission of the transmitter. The receiver will turn off its receiver before the end of the transmit window if no transmission (i.e., no packet) is detected. The receiver will turn off its receiver after a packet has been received, which can be near the end of the transmit window.

Figure 7:
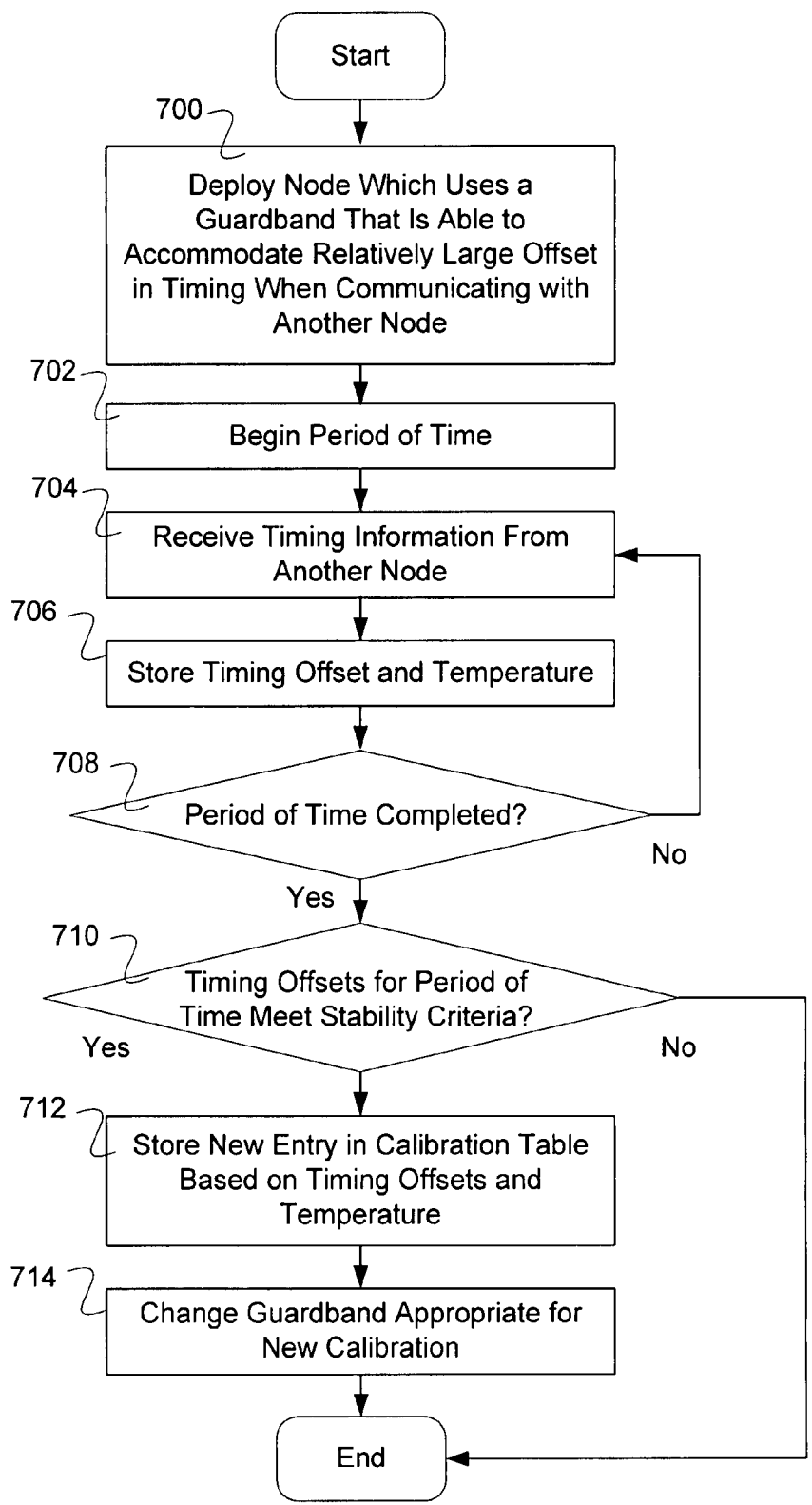
FIG. 7 is a flow diagram illustrating an embodiment of a process for setting a guardband time.

FIG. 7 is a flow diagram illustrating an embodiment of a process for setting a guardband time. In the example shown, in 700 a node is deployed which uses a guardband that is able to accommodate a relatively large offset in timing when communicating with another node. In some embodiments, during initial deployment of the mesh network system a node (sometimes referred to as a mote) is deployed to the field utilizing a 'standard' guardband width of GB1, where GB1 is wide enough to accommodate a relatively large crystal offset. In 702, the period of time is begun. In various embodiments, the period of time comprises a monitoring period during which it is desired that the timing offset between the node and another node is relatively stable or relatively small so that once a correction is made to a local clock that the clock of the local node and the other node are synchronized. In some embodiments, the temperature is also monitored to ensure that the temperature is stable during the period of time. For example, in the event that the temperature changes, the period of time can be restarted.

In 704, timing information is received from another node (e.g., using the arrival time of a packet, using timing information data within a packet, or any other appropriate way of conveying timing information). In some embodiments, the mote receives timing information from its parent(s) (e.g., a parent mesh network device is connected to the mesh network device and is between the mesh network device and a gateway). In 706, the timing offset and temperature is stored. The timing offset is calculated based at least in part on the received timing information. In various embodiments, temperature calibration, aging information, or other appropriate offsets are included in the timing offset calculation. In 708, it is determined if the period of time is complete. In the event that the period of time is not complete, then control passed to 704. In the event that the period of time is complete, then in 710 it is determined if the timing offset meets a stability criteria. For example, the timing offsets are below a threshold predetermined value, the average of the timing offsets is below a predetermined value, the standard deviation of the timing offsets is below a predetermined value, or any other appropriate criteria. For another example, the timing offsets are consistently off by a given tick-offset for a period of time (e.g., a predetermined number of counts of the crystal clock for a defined period of time such as a 10 second period), then the stability criteria is/are met. In the event that the stability criteria is/are met, then in 712 a new entry is stored in the calibration table based on the timing offsets and the temperature. In some embodiments, the mote notes the temperature and the average tick-offset in its compensation curve.

In 714, the guardband is changed to be appropriate for the new calibration, and the process ends. In some embodiments, both the node and the other node that the node is communicating with can switch their guardbands. Switching to a smaller guardband enabled by having more synchronized clocks saves power and possibly increases bandwidth (e.g., by enabling more transmission slots in a given time period due to the smaller guardbands). In the event that the timing offsets for the period of time do not meet the stability criteria, the process ends.

In some embodiments, a compensation table is updated in a mesh network device. For example, when mote experiences a temperature change of +/−X degrees (e.g., 1° C.), a learning algorithm is initiated that records the temperature and corresponding timing offset value difference between its clock and the clock of its parent(s) as derived from information received from its parent(s) (e.g., timing marker arrival time, packet header arrival, etc.); The calibration table is then updated based at least in part on the timing offset value(s) measured during the learning algorithm and the temperature at which the timing offset value(s) was/were measured.

Figure 8:
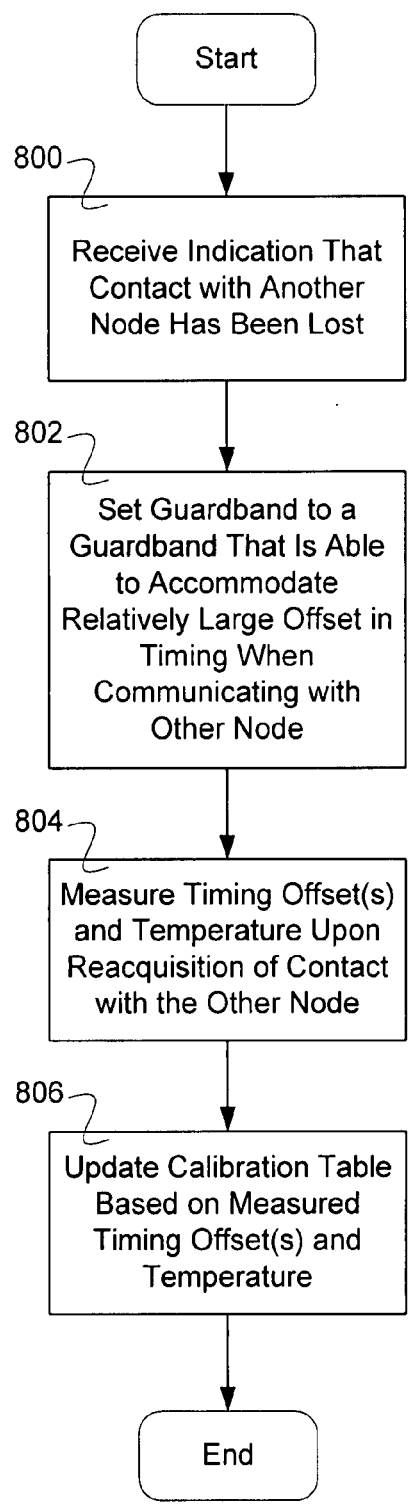
FIG. 8 is a flow diagram illustrating an embodiment of a process for resetting a guardband.

FIG. 8 is a flow diagram illustrating an embodiment of a process for resetting a guardband. In the example shown, in 800 an indication is received that contact has been lost (e.g., there has been no communications received from the other node in a predetermined period of time) with another node. In 802, the guardband is set to a guardband that is able to accommodate a relatively large offset in timing when communicating with another node. In 804, measure timing offset(s) and temperature upon reacquisition of contact with other node. In 806, update calibration table based on measured timing offset(s) and temperature. In some embodiments, timing offsets are measured using timing information received when packets are received from the other node.

Figure 9:
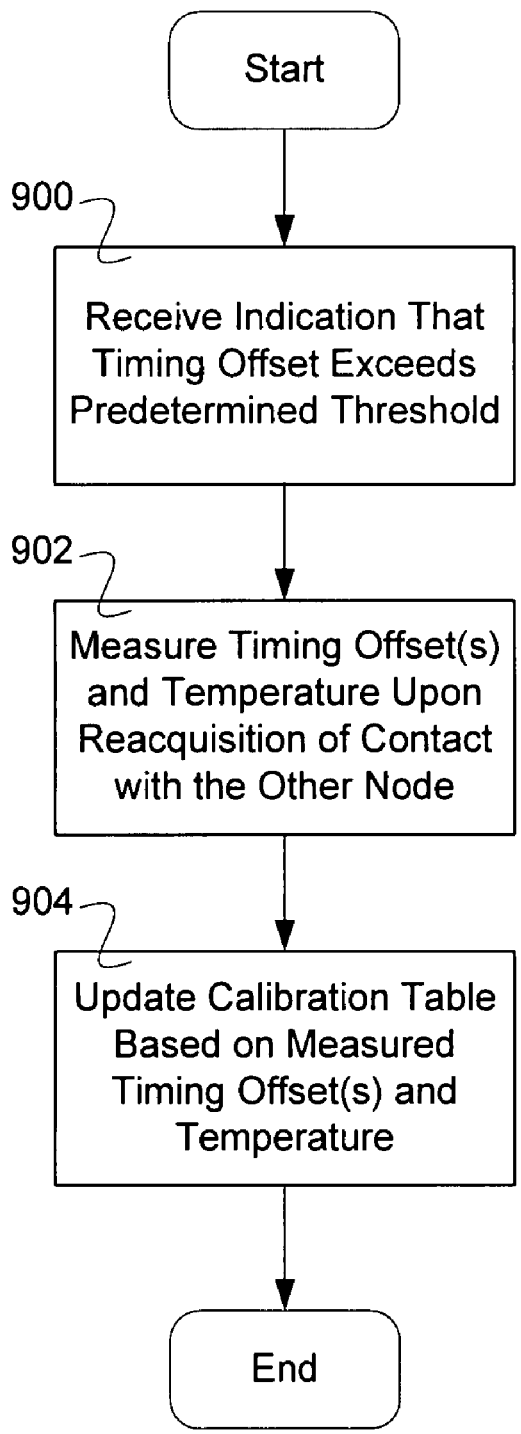
FIG. 9 is a flow diagram illustrating an embodiment of a process for automatically updating a calibration table.

FIG. 9 is a flow diagram illustrating an embodiment of a process for automatically updating a calibration table. In the example shown, in 900 an indication is received that a timing offset exceeds a predetermined threshold. In 902, measure timing offset(s) and temperature upon reacquisition of contact with other node. In 904, update calibration table based on measured timing offset(s) and temperature. In some embodiments, timing offsets are measured using timing information received when packets are received from the other node. In some embodiments, an accurate compensation table can be developed by a mesh network device over common operating temperatures, where the table continues to be updated over time. In some embodiments, updating improves compensation by adding more compensation table entries and enables compensation for drift due to aging so that new and old motes are also enabled to be able to maintain synchronization automatically.

Figure 10:
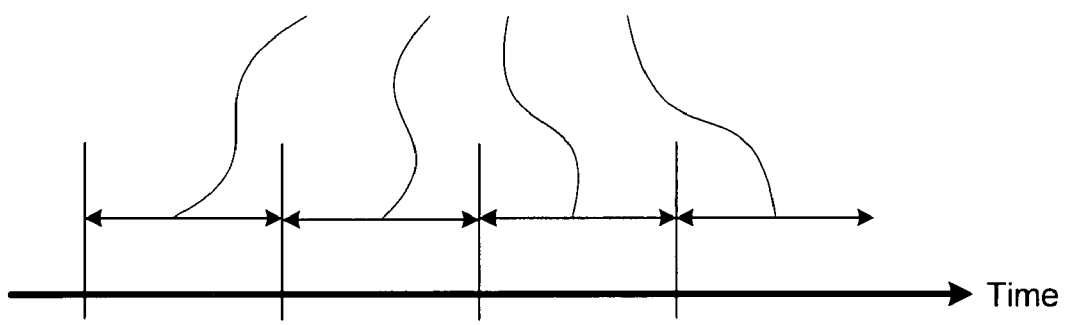
FIG. 10 is a block diagram illustrating an embodiment of a packet interval with timing information.

FIG. 10 is a block diagram illustrating an embodiment of a packet interval with timing information. In some embodiments, the packet interval with timing information comprises a keep alive interval. In the example shown, a packet is sent to a receiver at a regular interval. The packet includes information that can be used to extract timing information. The timing information can be used to adjust the receiving node's clock so that it can be better synchronized to the transmitting node (and ideally the mesh network).

In some embodiments, a mote receives timing information, a timing adjustment derived from the timing information, or a timing adjustment from a parent. In some embodiments, the timing information arrives using a transmit (TX) packet or a keep alive (KA) packet for a parent. In some embodiments, the timing information is used to calculate an adjustment to the current mesh network device clock counter. In some embodiments, the timing information is used to calculate an average value (e.g., a value expressed in parts per million) that is added to the temperature compensation for the mesh network device clock counter to adjust the device clock. In some embodiments, the keep alive interval or guardband is adjusted or not based at least in part on the timing information received from the parent. In various embodiments, the interval is multiplied by a first predetermined factor (e.g., doubled), divided by a second predetermined factor (e.g., divided in half), reduced by a first predetermined amount, increased by a second predetermined amount, or any other appropriate adjustment of the keep alive interval or guardband.

Figure 11:
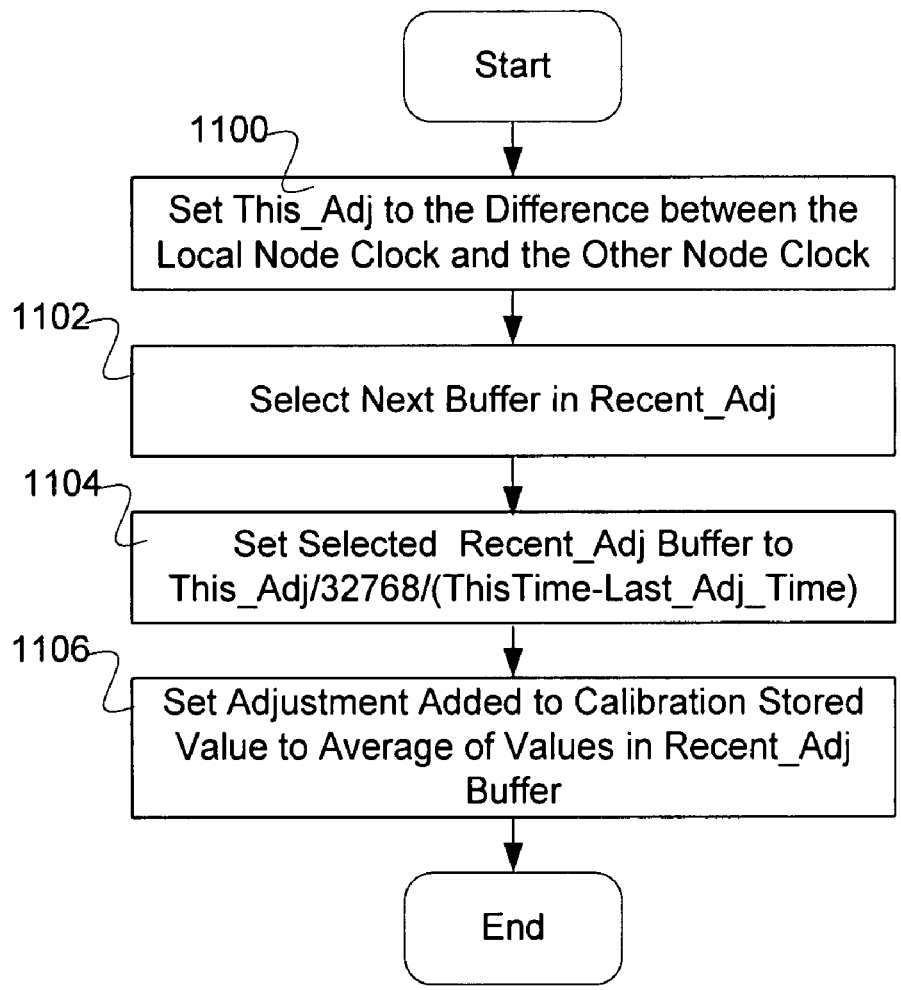
FIG. 11 is a flow diagram illustrating an embodiment of a process for determining an adjustment upon receipt of timing information.

FIG. 11 is a flow diagram illustrating an embodiment of a process for determining an adjustment upon receipt of timing information. In some embodiments, the adjustment determined in FIG. 11 is used to calculate a timing offset, where the timing offset comprises an adjustment from timing information received from a packet and correction from a stored table. In some embodiments, the adjustment from timing information is used to update a correction table at a given temperature. In some embodiments, the node determines an adjustment when the node receives an adjustment either upon receipt of a data packet or a keep alive packet. In the example shown, in 1100 this_adj is set to the difference between the local node clock and the other node clock. In some embodiments, this_adj is the number of ticks the local clock is required to be adjusted based on the information from a received packet. In 1102, a next buffer in recent_adj is selected. Recent_adj comprises a ring buffer that is configured to store N adjustments. In 1104, the selected buffer in recent_adj is set to this_adj/32768/(ThisTime—Last_Adj_Time). In some embodiments, ThisTime comprises universal time code for this synchronization event based on the arrival of the most recent received packet (data or keep alive); Last_Adj_Time comprises universal time code for the last synchronization event based on the arrival of the last most recent received packet (data or keep alive). In 1106, the adjustment added to the calibration stored value is set to the average of the values in the N (e.g., 8) recent_adj buffers. In some embodiments, recent_adj buffers contain adjustments that do not count any anticipatory adjustments (e.g., anticipated drift of the node clock with respect to another node's clock).

Figure 12:
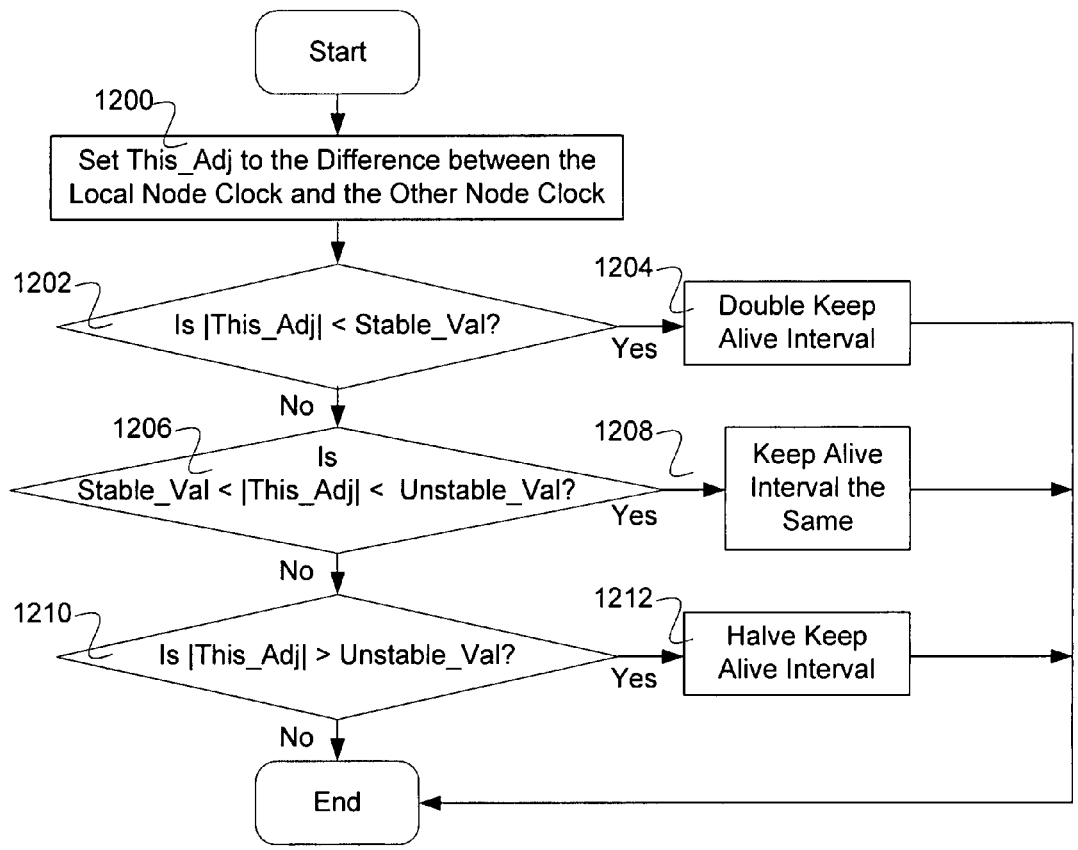
FIG. 12 is a flow diagram illustrating an embodiment of a procedure for adjusting a keep alive interval.

FIG. 12 is a flow diagram illustrating an embodiment of a procedure for adjusting a keep alive interval. In the example shown, in 1200 this_adj is set to the difference between the local node clock and the other node clock. In 1202, it is determined whether |this_adj| is less than stable_val (e.g., stable_val is the value below which the node clock is considered stable with respect to the other node's clock: 2 ppm of the local oscillator). If |this_adj| is less than stable_val, then in 1204 the keep alive interval is doubled and the process ends. If |this_adj| is not less than stable_val, then in 1206 it is determined whether |this_adj| is greater than stable_val and less than unstable_val (e.g., ustable_val is the value above which the node clock is not considered stable with respect to the other node's clock: 5 ppm of the local oscillator). If |this_adj| is greater than stable_val and less than unstable_val, then in 1208, the keep alive interval remains the same, and the process ends. If |this_adj| is not greater than stable_val and is not less than unstable_val, then in 1210 it is determined if |this_adj| is greater than unstable_val, then in 1212 the keep alive interval is halved, and the process ends.

In some embodiments, the difference between the local node clock and the other node clock is based at least in part on information received from packet (e.g., a data packet or a keep alive packet). In various embodiments, the node determines its keep alive interval based on one other node, more than one other node, or no other nodes.

In some embodiments, a keep alive interval is set to a default value (e.g., 60 seconds) until recent_adj gets a full set of entries (e.g., 8 entries). In various embodiments, a keep alive interval is agreed upon between a parent and a child; the parent mote comprises the first parent the mote joins, a parent mote with the most links, a parent mote with the lowest number of hops, or any other appropriate criteria for selecting a parent mote. In some embodiments, a mesh network device and its parent are the only devices required to know the keep alive interval. In some embodiments, a keep alive interval has a minimum bound value (e.g., 15 seconds) and a maximum bound value (e.g., 4 minutes or 8 minutes).

Figure 13:
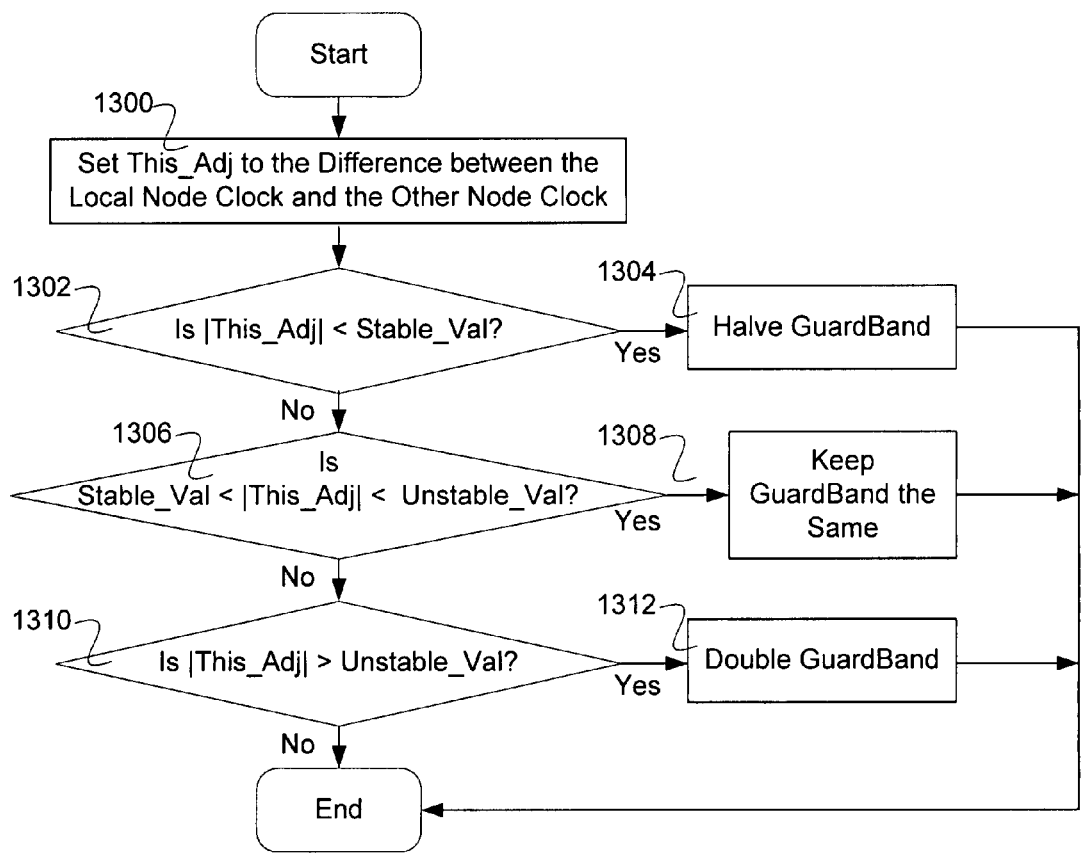
FIG. 13 is a flow diagram illustrating an embodiment of a procedure for adjusting a guardband.

FIG. 13 is a flow diagram illustrating an embodiment of a procedure for adjusting a guardband. In the example shown, in 1300 this_adj is set to the difference between the local node clock and the other node clock. In 1302, it is determined whether |this_adj| is less than stable_val (e.g., stable_val is the value below which the node clock is considered stable with respect to the other node's clock: 2 ppm of the local oscillator). If |this_adj| is less than stable_val, then in 1304 the guardband is halved and the process ends. If |this_adj| is not less than stable_val, then in 1306 it is determined whether |this_adj| is greater than stable_val and less than unstable_val (e.g., ustable_val is the value above which the node clock is not considered stable with respect to the other node's clock: 5 ppm of the local oscillator). If |this_adj| is greater than stable_val and less than unstable_val, then in 1308, the guardband remains the same, and the process ends. If |this_adj| is not greater than stable_val and is not less than unstable_val, then in 1310 it is determined if |this_adj| is greater than unstable_val, then in 1312 the guardband is doubled, and the process ends. The guardband is the length of time that a receiver listens for a transmission after waking up during a scheduled slot.

In some embodiments, a guardband is set to a default value (e.g., 1 millisecond) until recent_adj gets a full set of entries (e.g., 8 entries). In various embodiments, a parent mote comprises the first parent the mote joins, a parent mote with the most links, a parent mote with the lowest number of hops, or any other appropriate criteria for selecting a parent mote. In some embodiments, a mesh network device and its parent are the only devices required to know the guardband. In some embodiments, a guardband has a minimum bound value (e.g., 100 microseconds) and a maximum bound value (e.g., 10 milliseconds).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for timing synchronization for mesh networks comprising:
   receiving a timing information at a parent node, wherein the timing information is from a received packet, wherein the received packet is sent at a keep-alive interval by a child node using a link to the parent node, and wherein the parent node activates its receiver in a guardband, wherein the guardband has a duration of a guardband duration;
   determining a clock offset based at least in part on the timing information;
   indicating that a decision is to be made to adjust a characteristic of the link based at least in part on the clock offset, wherein the adjustment of the characteristic causes a subsequent transmission from the child node to the parent node to be less likely to be missed due to a timing mismatch between when a next packet is sent by the child node and when the parent node receiver is enabled to receive the next packet, wherein the characteristic comprises the keep alive interval or a guardband time, wherein the subsequent transmission is made according to a repeating frame that indicates a time slot and a frequency for the child node and the parent node to communicate; and
   transmitting from the parent node to the child node a value representative of the clock offset.

2. A method as in claim 1, wherein indicating to adjust the characteristic of the link comprises indicating to adjust the guardband duration at the parent node.

3. A method as in claim 2, wherein adjusting the guardband duration comprises setting a new guardband duration that is half of the guardband duration.

4. A method as in claim 2, wherein adjusting the guardband duration comprises setting a new guardband duration that is double the guardband duration.

5. A method as in claim 1, wherein indicating to adjust the characteristic of the link comprises indicating to adjust the guardband duration the parent node and indicating to adjust the keep alive interval at the child node.

6. A method as in claim 1, wherein indicating to adjust the characteristic of the link comprises indicating to adjust the keep alive interval at the child node.

7. A method as in claim 1, wherein the value representative of the clock offset is used to shorten the keep alive interval or lengthen the keep alive interval.

8. A method as in claim 1, wherein the decision to make an adjustment is made by one of the following: the parent node, the child node, the parent node and the child node, or a gateway manager.

9. A method as in claim 1, wherein a packet is sent by the parent node to the child node between a keep alive sent at the keep alive intervals.

10. A method as in claim 1, wherein a packet is received by the parent node from the child node between a keep alive sent at the keep alive intervals.

11. A method as in claim 1, wherein the keep alive interval is regular interval such that a keep alive is sent periodically.

12. A system for timing synchronization for mesh networks comprising:
   a processor configured to:
   receive a timing information at a parent node, wherein the timing information is from a received packet, wherein the received packet is sent at a keep-alive interval by a child node using a link to the parent node, and wherein the parent node activates its receiver in a guardband, wherein the guardband has a duration of a guardband duration;

determine a clock offset based at least in part on the timing information;

indicate that a decision is to be made to adjust a characteristic of the link based at least in part on the clock offset, wherein the adjustment of the characteristic causes a subsequent transmission from the child node to the parent node to be less likely to be missed due to a timing mismatch between when a next packet is sent by the child node and when the parent node receiver is enabled to receive the next packet, wherein the characteristic comprises the keep alive interval or a guardband time, wherein the subsequent transmission is made according to a repeating frame that indicates a time slot and a frequency for the child node and the parent node to communicate;

transmit from the parent node to the child node a value representative of the clock offset; and a memory coupled to the processor and configured to provide the processor with instructions.

13. A system as in claim 12, wherein indicating to adjust the characteristic of the link comprises indicating to adjust the guardband duration at the parent node.

14. A system as in claim 13, wherein adjusting the guardband duration comprises setting a new guardband duration that is half of the guardband duration.

15. A system as in claim 13, wherein adjusting the guardband duration comprises setting a new guardband duration that is double the guardband duration.

16. A system as in claim 12, wherein indicating to adjust the characteristic of the link comprises indicating to adjust the guardband duration the parent node and indicating to adjust the keep alive interval at the child node.

17. A system as in claim 12, wherein indicating to adjust the characteristic of the link comprises indicating to adjust the keep alive interval at the child node.

18. A system as in claim 12, wherein the value representative of the clock offset is used to shorten the keep alive interval or lengthen the keep alive interval.

19. A system as in claim 12, wherein the decision to make an adjustment is made by one of the following: the parent node, the child node, the parent node and the child node, or a gateway manager.

20. A system as in claim 12, wherein a packet is sent by the parent node to the child node between a keep alive sent at the keep alive intervals.

21. A system as in claim 12, wherein a packet is received by the parent node from the child node between a keep alive sent at the keep alive intervals.

22. A system as in claim 12, wherein the keep alive interval is regular interval such that a keep alive is sent periodically.

23. A computer program product for timing synchronization for mesh networks, the computer program product being embodied in a non-transitory computer readable storage medium and comprising computer instructions for:

receiving a timing information at a parent node, wherein the timing information is from a received packet, wherein the received packet is sent at a keep-alive interval by a child node using a link to the parent node, and wherein the parent node activates its receiver in a guardband, wherein the guardband has a duration of a guardband duration;

determining a clock offset based at least in part on the timing information;

indicating that a decision is to be made to adjust a characteristic of the link based at least in part on the clock offset, wherein the adjustment of the characteristic causes a subsequent transmission from the child node to the parent node to be less likely to be missed due to a timing mismatch between when a next packet is sent by the child node and when the parent node receiver is enabled to receive the next packet, wherein the characteristic comprises the keep alive interval or a guardband time, wherein the subsequent transmission is made according to a repeating frame that indicates a time slot and a frequency for the child node and the parent node to communicate; and transmitting from the parent node to the child node a value representative of the clock offset.

* * * * *